United States Patent
Karlsson et al.

[11] Patent Number: 5,879,975
[45] Date of Patent: Mar. 9, 1999

[54] HEAT TREATING NITROGEN IMPLANTED GATE ELECTRODE LAYER FOR IMPROVED GATE ELECTRODE ETCH PROFILE

[75] Inventors: Olov Karlsson, San Jose; Effiong Ibok, Sunnyvale; Dong-Hyuk Ju, Cupertino; Scott A. Bell, San Jose; Daniel A. Steckert, San Jose; Robert Ogle, San Jose, all of Calif.

[73] Assignee: Advanced Micro Devices, Inc., Sunnyvale, Calif.

[21] Appl. No.: 924,322

[22] Filed: Sep. 5, 1997

[51] Int. Cl.[6] .................................................. H01L 21/00
[52] U.S. Cl. ........................... 438/162; 438/585; 438/592; 438/659; 438/660; 438/669; 438/705; 438/719
[58] Field of Search ..................................... 438/585, 592, 438/659, 660, 162, 669, 705, 719, 720, 532

[56] References Cited

U.S. PATENT DOCUMENTS

| | | | |
|---|---|---|---|
| 4,351,695 | 9/1982 | Hieber et al. | 438/660 |
| 4,358,326 | 11/1982 | Doo | 438/660 |
| 4,682,407 | 7/1987 | Wilson et al. | 438/162 |
| 4,818,711 | 4/1989 | Choksi et al. | 438/659 |
| 4,897,368 | 1/1990 | Kobushi et al. | 438/659 |
| 4,900,396 | 2/1990 | Hayashi et al. | 156/651 |
| 4,914,046 | 4/1990 | Tobin et al. | 438/659 |
| 4,925,805 | 5/1990 | Van Ommen et al. | 438/407 |
| 5,464,792 | 11/1995 | Tseng et al. | 438/585 |
| 5,508,212 | 4/1996 | Wang et al. | 438/659 |
| 5,605,848 | 2/1997 | Ngaoaram | 438/287 |
| 5,633,200 | 5/1997 | Hu | 438/659 |
| 5,739,064 | 4/1998 | Hu et al. | 438/532 |

*Primary Examiner*—John F. Niebling
*Assistant Examiner*—Lynne A. Gurley

[57] ABSTRACT

The etch profile of side surfaces of a gate electrode is improved by heat treating the gate electrode layer after nitrogen implantation and before etching to form the gate electrode. Nitrogen implantation at high dosages to prevent subsequent impurity penetration through the gate dielectric layer, e.g., B penetration, amorphizes the upper portion of the gate electrode layer resulting in concave side surfaces upon etching to form the gate electrode. Heat treatment performed after nitrogen implantation can restore sufficient crystallinity so that, after etching the gate electrode layer, the side surfaces of the resulting gate electrode are substantially parallel.

14 Claims, 1 Drawing Sheet

HEAT TREATING NITROGEN IMPLANTED GATE ELECTRODE LAYER FOR IMPROVED GATE ELECTRODE ETCH PROFILE

TECHNICAL FIELD

The present invention relates to a method of manufacturing a semiconductor device comprising a gate electrode with substantially parallel side surfaces. The present invention is particularly applicable for producing high density semiconductor devices with design features of 0.25 microns and under, increased transistor and circuit speeds and improved reliability.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

As integration increases and device feature size decreases, the thickness of gate dielectric layers decreases. As device feature sizes shrink to 0.25 microns and under, the gate dielectric layer thickness is reduced to below about 80 Å, thereby generating various problems, such as impurity penetration through the gate dielectric layer into the semiconductor substrate with consequential shorting out of the transistor and/or otherwise decreasing device reliability. For example, when forming P-channel MOS transistors, boron is typically implanted into the gate electrode layer before etching to form the gate electrode. Such implanted boron easily diffuses through a thin gate dielectric layer into the underlying silicon substrate and shorts out or shifts the transistor.

A conventional approach in addressing such an impurity penetration problem comprises implanting nitrogen into the gate electrode layer before forming the gate electrode by conventional photolithographic and etching techniques. For example, adverting to FIG. 1, a gate dielectric layer 11, such as a silicon dioxide layer, is formed at a thickness less than about 80 Å on semiconductor substrate 10, typically silicon doped with an appropriate impurity, such as an N-type impurity. A conductive layer 12, such as polycrystalline silicon, is formed on gate dielectric layer 11 and serves as the gate electrode layer. In order to suppress subsequent dopant penetration through gate dielectric layer 11, such as boron penetration, nitrogen ions are implanted into gate electrode layer 12, as indicated by arrows 14, at a dosage of about $1 \times 10^{13}$ atoms cm$^{-2}$ to about $1 \times 10^{16}$ atoms cm$^{-2}$. Such high nitrogen implantation dosages cause crystallographic damage to gate electrode layer 12 and consequential amorphization of an upper portion thereof indicated by "x" marks 15. Such a nitrogen induced amorphous region can extend through about fifty percent of the thickness of polycrystalline silicon layer 12.

It was found that the nitrogen induced amorphous portion exhibits etching characteristics different from the remaining crystalline portion of gate electrode layer 12. Upon masking and etching to form gate electrode 22 on semiconductor substrate 10 with gate dielectric layer 21 therebetween, as shown in FIG. 2, the side surfaces of gate electrode 22 are neither substantially parallel to one another nor substantially perpendicular to the upper surface of semiconductor substrate 10, as desired for optimum performance and reliability. Instead, as shown in FIG. 2, the side surfaces 23 of etched gate electrode 22 are concave forming an hourglass type profile. Such an etch profile could cause transistor performance degradation, e.g., transistor drive current non-uniformities and asymmetry.

Thus, the conventional solution to the problem of impurity penetration through thin gate dielectric layers comprising remedial nitrogen ion implantation is problematic with respect to the etch profile of the subsequently patterned gate electrode. Accordingly, there exists a need for a method of manufacturing a semiconductor device wherein impurity penetration through a thin gate dielectric layer is prevented by nitrogen ion implantation without adverse impact on the etch profile of the subsequently formed gate electrode.

DISCLOSURE OF THE INVENTION

An object of the present invention is a method of manufacturing a semiconductor device comprising a gate electrode with substantially parallel side surfaces while preventing impurity penetration through the gate dielectric layer.

Another object of the present invention is a method of manufacturing a semiconductor device having design features of up to about 0.25 microns and comprising a P-channel MOS transistor and a gate electrode with substantially parallel side surfaces, while preventing boron penetration through the gate dielectric layer.

Additional advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, which method comprises: forming a conductive layer on an upper surface of a semiconductor substrate with a dielectric layer therebetween; implanting nitrogen atoms into the conductive layer; heat treating the nitrogen implanted conductive layer; and etching the heat treated nitrogen implanted layer to form a gate electrode.

Another aspect of the present invention is a method of manufacturing a semiconductor device, which method comprises: forming a polycrystalline silicon gate electrode layer on an upper surface of a semiconductor substrate with a gate dielectric layer therebetween; implanting nitrogen atoms into the polycrystalline silicon gate electrode layer at a dosage sufficient to amorphize an upper portion of the polycrystalline silicon gate electrode layer; heat treating the nitrogen implanted polycrystalline silicon layer to restore crystallinity to the amorphized upper portion; and etching the heat treated nitrogen implanted polycrystalline silicon layer to form a gate electrode with substantially parallel side surfaces.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the e invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
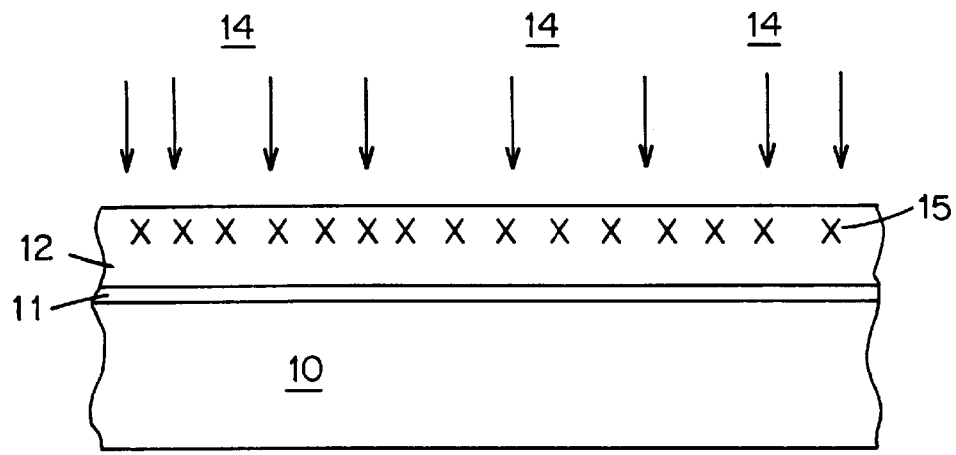
FIG. 1 schematically illustrates conventional methodology involving nitrogen implantation into a gate electrode layer.
Figure 2:
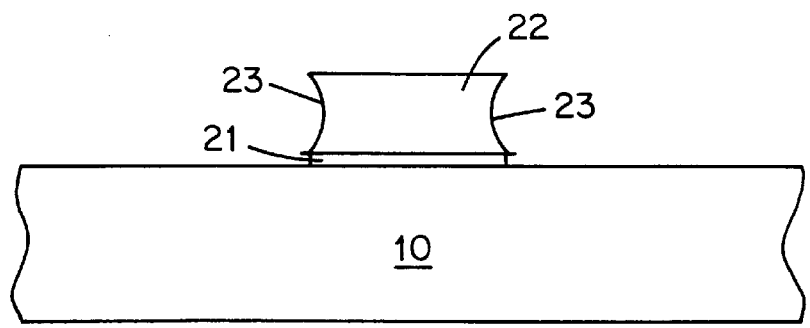
FIG. 2 schematically illustrates the undesirable formation of a gate electrode with concave side surfaces attendant upon conventional practices.

The present invention addresses the problematic etch profile resulting from nitrogen ion implantation into a gate electrode layer to prevent subsequent penetration of the underlying gate dielectric layer by impurity atoms, such as boron when forming a P-channel CMOS transistor. Increasing demands for densification and miniaturization require shrinkage of feature sizes to 0.25 microns and under. Such reduced design features require the formation of gate dielectric layers, such as silicon dioxide, having a thickness less than about 80 Å, e.g. about 30 Å to about 70 Å. Such thin gate dielectric layers are easily penetrated by impurity atoms subsequently introduced in forming transistor gate electrodes, e.g., penetration by boron atoms when forming a P-channel transistor. The conventional remedial approach to such gate dielectric impurity penetration comprises introducing nitrogen atoms at high dosages of about $1\times10^{13}$ atoms $cm^{-2}$ to about $1\times10^{16}$ atoms $cm^{-2}$ causing amorphization of up to about 50% of the thickness of polycrystalline silicon gate electrode layer 12, as shown in FIG. 1. Such amorphization alters the etching characteristics of polycrystalline silicon gate electrode layer 12 so that, after subsequent masking and etching to form gate electrode 22 (FIG. 2), the side surfaces 23 are neither substantially parallel to one another nor substantially perpendicular to the upper surface of semiconductor substrate 10. Instead, the side surfaces 23 of gate electrode 22 are concave, i.e., exhibit an hourglass structure, thereby adversely impacting device performance.

The present invention addresses and solves the gate electrode etch profile problem stemming from nitrogen induced amorphization, thereby enabling the use of nitrogen ion implantation to prevent subsequent impurity penetration through thin gate dielectric layers while maintaining a desirable etch profile for the gate electrode so that the etched gate electrode has substantially parallel side surfaces and/or side surfaces which are substantially perpendicular to the upper surface of the semiconductor substrate. In accordance with the present invention, a gate electrode layer, e.g., polycrystalline silicon, is formed on a semiconductor substrate with a thin gate dielectric layer therebetween. As in conventional practices, the gate electrode layer is subjected to nitrogen implantation at a dosage of about $1\times10^{13}$ atoms $cm^{-2}$ to about $1\times10^{16}$ atoms $cm^{-2}$. Consequently, an upper portion of polycrystalline silicon gate electrode layer is amorphized, thereby altering the etching characteristics of the gate electrode layer. However, the present invention departs from such conventional practices by performing a heat treatment step after nitrogen ion implantation and before etching the gate electrode layer to form the gate electrode. The heat treatment step is performed under conditions to restore sufficient crystallinity to the amorphized upper portion of the polycrystalline silicon gate electrode layer to enable subsequent etching of the polycrystalline silicon gate electrode layer to form a gate electrode having side surfaces which are substantially parallel to one another and, preferably, substantially perpendicular to the upper surface of the semiconductor substrate. Thus, in accordance with the present invention, heat treatment is strategically performed after the amorphizing nitrogen ion implantation to restore sufficient crystallinity to enable formation of a gate electrode exhibiting an improved etch profile.

Figure 3:
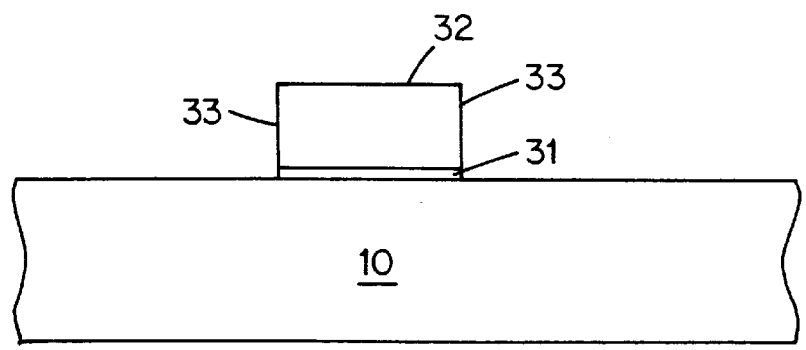
FIG. 3 schematically illustrates a gate electrode formed in accordance with the present invention having an improved etch profile.

An embodiment of the present invention is schematically illustrated in FIG. 3, wherein gate electrode 32 is formed on semiconductor substrate 10 with gate dielectric layer 31 therebetween, employing methodology paralleling conventional practices, but differing by strategically heat treating after nitrogen ion implantation and before patterning the gate electrode by conventional photolithographic and etching techniques. The strategically performed heat treatment step of the present is conducted under conditions to restore sufficient crystallinity, preferably to restore substantially pre-nitrogen implantation crystallinity, so that the resulting etched gate electrode has substantially parallel side surfaces 33 which are also substantially perpendicular to the upper surface of the semiconductor substrate 10. It was found that the strategically performed heat treatment after nitrogen implantation and prior to etching does not adversely affect the ability of the implanted nitrogen to substantially prevent subsequent impurity penetration, e.g. boron penetration, through the thin gate dielectric layer.

In an embodiment of the present invention, a silicon dioxide gate dielectric layer, having a thickness of about 30 Å to about 70 Å, is formed on a silicon semiconductor substrate containing an N-type impurity. A polycrystalline silicon gate electrode layer is formed on the silicon dioxide gate dielectric layer. Nitrogen ions are implanted into the polycrystalline gate electrode layer at a sufficient dosage to prevent subsequent impurity (boron) penetration through the silicon dioxide gate dielectric layer, e.g., at a nitrogen ion implantation dosage of about $1\times10^{13}$ atoms $cm^{-2}$ to about $1\times10^{16}$ atoms $cm^{-2}$. As a result of such nitrogen ion implantation, a substantial upper portion of the polycrystalline silicon gate electrode layer is amorphized, thereby altering its etching characteristics. According to the present invention, heat treatment is conducted under conditions which restore sufficient crystallinity to the amorphized upper portion of the polycrystalline silicon gate electrode layer to enable subsequent etching to form a gate electrode having substantially parallel side surfaces and/or side surfaces substantially perpendicular to the upper surface of the semiconductor substrate. Given the disclosed objective of restoring sufficient crystallinity to improve the subsequently patterned gate electrode etch profile, one having ordinary skill in the art can easily optimize the relevant heat treatment parameters to achieve that objective. For example, it has been found suitable to heat treat the nitrogen implanted polycrystalline silicon layer at a temperature of about 600° C. to about 1,000° C., such as about 700° C. to about 900° C., in a nonreactive atmosphere. During actual testing, it was found that, after nitrogen ion implantation at a dosage of about $1\times10^{15}$ atoms $cm^{-2}$, a rapid thermal anneal at a temperature of about 850° C. for about 30 seconds in a nitrogen atmosphere containing about 10 volume percent oxygen was effective to restore sufficient crystallinity to the amorphized upper portion of a polycrystalline silicon gate electrode layer to enable subsequent patterning by conventional photolithography and etching techniques to form a gate electrode with side surfaces substantially parallel to one another and substantially perpendicular to the upper surface of the semiconductor substrate. A gate electrode having a similar desirable etch profile was obtained after nitrogen ion implantation at a dosage of about $1 \times 10^{15}$ atoms $cm^{-2}$ by heat treating at a temperature of about 750° C. for about 30 minutes in a nitrogen atmosphere.

The present invention advantageously enables the use of conventional nitrogen implantation to prevent impurity penetration through thin gate dielectric layers while avoiding the adverse impact on the side surfaces of a subsequently patterned gate electrode by etching. In accordance with the present invention, a heat treatment step is strategically performed after nitrogen ion implantation and prior to etching, thereby enabling the formation of a gate electrode having an improved etch profile, e.g., a gate electrode with substantially parallel side surfaces and/or substantially perpendicular side surfaces with respect to the upper surface of the semiconductor substrate.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order to not unnecessarily obscure the present invention.

The dielectric and conductive layers utilized in manufacturing a semiconductor device in accordance with the present invention can be deposited by conventional deposition techniques. For example, metallization techniques such as various types of chemical vapor deposition (CVD) processes, including low pressure chemical vapor deposition (LPCVD) and enhanced chemical vapor deposition (ECVD) can be employed.

The present invention enjoys applicability in the manufacture of semiconductor devices comprising design features of 0.25 microns and under, with increased transistor and circuit speeds and improved reliability. The present invention is applicable to the formation of any of various types of semiconductor devices and, hence, details have not been set forth herein in order to avoid obscuring the thrust of the present invention. In practicing the present invention, conventional photolithographic and etching techniques are employed and, hence, the details of such techniques have not been set forth herein in detail.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

forming a polycrystalline silicon layer on an upper surface of a semiconductor substrate with a dielectric layer therebetween;

implanting nitrogen atoms into the polycrystalline silicon layer at a dosage sufficient to amorphize an upper portion of the polycrystalline silicon layer;

heat treating said nitrogen implanted polycrystalline silicon layer under conditions sufficient to restore crystallinity to the amorphized upper portion of the polycrystalline silicon layer; and etching the heat treated nitrogen implanted layer to form a gate electrode, wherein said heat treating improves the etch profile of the gate electrode.

2. The method according to claim 1, comprising implanting nitrogen at a dosage sufficient to amorphize the upper portion extending up to about 50% of the polycrystalline silicon gate electrode layer toward the upper surface of the semiconductor substrate.

3. The method according to claim 1, comprising:

etching the polycrystalline silicon layer to form a gate electrode having substantially parallel side surfaces.

4. The method according to claim 3, comprising etching the polycrystalline silicon layer to form a gate electrode having side surfaces substantially perpendicular to the upper surface of the semiconductor substrate.

5. The method according to claim 3, comprising heat treating the nitrogen implanted polycrystalline silicon layer at a temperature of about 600° C. to about 1,000° C.

6. The method according to claim 5, comprising heat treating the nitrogen implanted polycrystalline silicon layer at a temperature of about 850° C. for about 30 seconds in an atmosphere comprising nitrogen and about 10 volume percent oxygen.

7. The method according to claim 5, comprising heat treating the nitrogen implanted polycrystalline silicon layer at a temperature of about 750° C. for about 30 minutes in a nitrogen atmosphere.

8. The method according to claim 1, further comprising:

forming a mask on the nitrogen implanted polycrystalline silicon layer after heat treating; and etching the heat treated masked polycrystalline silicon layer to form the gate electrode.

9. The method according to claim 1, wherein the semiconductor substrate comprises an N-type impurity.

10. The method according to claim 9, further comprising forming P-impurity type source/drain regions in the semiconductor substrate on opposite sides of the gate electrode to form a P-channel MOS.

11. The method according to claim 1, comprising:

implanting nitrogen under conditions sufficient to amorphize an upper portion of the polycrystalline silicon layer;

heat treating to restore sufficient crystallinity to the amorphized upper portion to enable formation of a gate electrode having substantially parallel side surfaces upon etching the polycrystalline silicon film; and etching the polycrystalline silicon film to form a gate electrode having substantially parallel side surfaces.

12. The method according to claim 11, comprising etching the heat treated polycrystalline silicon film to form a gate electrode having side surfaces substantially perpendicular to the upper surface of the semiconductor substrate.

13. The method according to claim 1, wherein the dielectric layer has a thickness less than about 60 Å.

14. The method according to claim 1, comprising heat treating the nitrogen implanted polycrystalline silicon layer before depositing any layer thereon.

* * * * *